US010338614B1

(12) United States Patent
Day et al.

(10) Patent No.: US 10,338,614 B1
(45) Date of Patent: Jul. 2, 2019

(54) LOW DROPOUT LINEAR REGULATOR WITH INTERNALLY COMPENSATED EFFECTIVE SERIES RESISTANCE

(71) Applicant: Analog Devices, Inc., Norwood, MA (US)

(72) Inventors: Brandon Day, Seattle, WA (US); Mukesh Kumar, Fairfax, VT (US); James R. Dean, Redmond, WA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/961,587

(22) Filed: Apr. 24, 2018

(51) Int. Cl.
  *G05F 1/44* (2006.01)
  *H03H 11/12* (2006.01)
(52) U.S. Cl.
  CPC .......... *G05F 1/44* (2013.01); *H03H 11/1204* (2013.01)
(58) Field of Classification Search
  CPC .... H02M 3/156; H02M 3/158; H02M 3/1588; H02M 2003/1566; H02M 3/155; G05F 1/644; G05F 1/648; G05F 1/63; G05F 1/652; G05F 1/44
  See application file for complete search history.

(56) References Cited

U.S. PATENT DOCUMENTS

| 5,191,278 | A | 3/1993 | Carpenter et al. |
| 6,541,946 | B1 | 4/2003 | Chen et al. |
| 6,806,690 | B2 | 10/2004 | Xi |
| 7,531,996 | B2 | 5/2009 | Yang |
| 7,719,241 | B2 | 5/2010 | Dean |
| 2002/0005711 | A1 | 1/2002 | Bakker et al. |
| 2012/0161734 | A1* | 6/2012 | Wu .......................... G05F 1/575 323/282 |

OTHER PUBLICATIONS

"1 A, Low VIN, Low Noise, CMOS Linear Regulator", Analog Devices Data Sheet, (2016), 18 pgs.
"1.2 A, Ultralow Noise, High PSRR, RF Linear Regulator", Analog Devices Data Sheet, (2016), 22 pgs.
"5 A, Low VIN, Low Noise, CMOS Linear Regulator", Analog Devices Data Sheet, (2017), 20 pgs.

* cited by examiner

*Primary Examiner* — Jue Zhang
*Assistant Examiner* — Afework Demisse
(74) *Attorney, Agent, or Firm* — Schwegman Lundberg & Woessner, P.A.

(57) ABSTRACT

A voltage regulator circuit having an internally compensated effective series resistance includes a control circuit to generate an out current at a regulated output voltage based on a reference voltage. The control circuit includes an amplifier, a resistive element to feedback output voltage to an input of the amplifier, and a compensation circuit to couple the internally compensated effective series resistance into the control circuit. The compensation circuit includes a first current sense device to generate a first sensed current proportional to a current through an N-type pass device, a second current sense device arranged to generate a second sensed current proportional to the current through the N-type pass device, and a bias circuit coupled to sink the first sensed current and the second sensed current to reduce a bias voltage across the resistive element below a threshold voltage.

24 Claims, 5 Drawing Sheets

LOW DROPOUT LINEAR REGULATOR WITH INTERNALLY COMPENSATED EFFECTIVE SERIES RESISTANCE

FIELD OF THE DISCLOSURE

This document pertains generally, but not by way of limitation, to electrical circuits, and more particularly, to low drop-out linear regulator circuits.

BACKGROUND

A low dropout (LDO) linear regulator is typically used to generate a stable (e.g., regulated) output voltage supply from an input source supply. These regulators are particularly useful to devices that require low noise, high accuracy power supplies. Such devices, however, can also have circuits that are sensitive to transient changes in their supply voltage. The performance of LDO linear regulators in these circuits can depend on the resilience of the regulators to such transient changes. Such responses can be heavily influenced by the characteristics of external circuits coupled to the output of the LDO linear regulator, such as parasitic elements associated with a load circuit and the electrical traces coupling a regulator to a load circuit. Typical techniques for improving the resilience of an LDO regulator include adding external circuitry to cancel or offset the effects of parasitic elements and the operation of external circuits coupled to the regulator.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure describes, among other things, a low dropout linear regulator circuit (hereinafter, "LDO regulator") architecture having a direct current (DC) coupled internally compensated effective series resistance, which can provide a regulated voltage over a wide output impedance range while improving overall control loop bandwidth, which, in turn, can enable a system to be designed with greater flexibility in component selection and circuit board routing. The internally compensated effective series resistance can improve the frequency response of an LDO regulator to voltage supply transients and the operation of external circuits without having to add external compensating circuitry to a system. This can improve the stability of the output voltage supplied to devices that require low noise, high accuracy power supplies without increasing component count.

Figure 1:
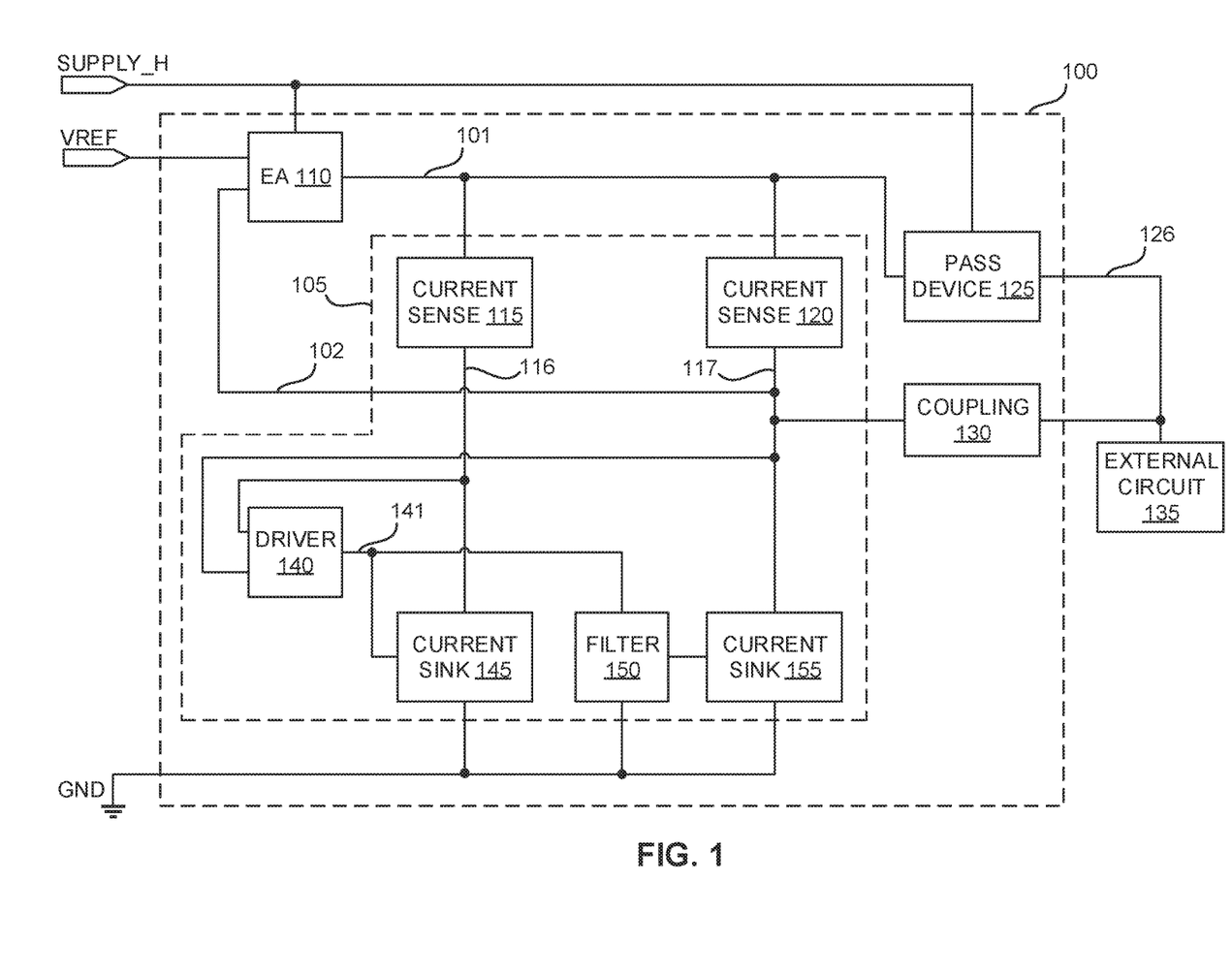
FIG. 1 depicts a block diagram of a low dropout linear regulator having an internally compensated effective series resistance, according to various embodiments.

FIG. 1 depicts a block diagram of LDO regulator 100 having an internally compensated effective series resistance, according to various embodiments. The LDO regulator 100 can convert an input supply voltage (SUPPLY_H) to a regulated output voltage based on a voltage reference (VREF). The regulated output voltage can be provided to an external circuit 135. The external circuit 135 can include a load circuit, such as one or more circuits associated with a low voltage device, such as a processor, a sensor, or an amplifier. The external circuit 135 can also include parasitic elements (hereinafter, "parasitics") associated with the physical circuit board traces coupling the LDO regulator 100 to the external circuit. The resistive components of the impedance associated with elements of the load circuit, such as an output capacitor, can insert a transfer function "zero" at a certain frequency in a control loop of the LDO regulator 100. Additionally, the inductive reactance of the parasitic elements coupled with the capacitive reactance of output capacitor and the capacitive elements in the load circuit can generate a resonance in the control loop of the LDO regulator 100. The performance and stability of the LDO regulator 100 can be adversely affected if the frequency of the zero or the resonance frequency fall within the operating bandwidth of the regulator.

In FIG. 1, the LDO regulator 100 can include an error amplifier (EA) circuit 110, a compensation circuit 105, a pass device 125, and coupling element 130. The EA circuit 110, can be any circuit configured to generate an output signal, such as a voltage, in response to a reference voltage (VREF) and a feedback signal, such that its output signal is adjustable by the EA circuit to cause the feedback signal to match, or correspond with, the reference signal. The feedback signal can be received from branch 102 at a feedback input of the EA circuit 110, while the output signal can be generated on branch 101. The EA circuit 110 can include certain current sources or amplifiers, such as a differential amplifier or an operational amplifier and a compensation network. The pass device 125 can include an adjustable current source, a voltage-to-current converter, or transconductance device, such as an N-type field-effect transistor (FET), or a bipolar junction transistor (BJT). An N-type FET pass device is useful for low LDO output voltage requirements where a higher voltage bias supply is also available on chip, such as when an LDO regulator is included in power management integrated circuits (PMICs). Additionally, an N-type FET pass device can typically be made smaller than a PMOS device for given overdrive, dropout voltages and output currents. Such N-type FET pass devices allows turning on the device hard while keeping a low headroom (VIN-VOUT) for low power dissipation. The pass device 125 can be configured to generate an output signal, such as an output current at a regulated voltage, on branch 126 using a control signal sensed from branch 101. The output signal on branch 126 can be used to drive the external circuit 135. The output signal can be fed back to the EA circuit 110 through coupling element 130, such as to form a control loop or control circuit using the EA circuit 110, the coupling element, and the pass device 125. In certain embodiments, the coupling element 130 can include a passive device, such as a resistor.

In FIG. 1, the compensation circuit 105 can include any circuit configured to couple an internally compensated effective series resistance into control circuit, such as into the control loop formed by EA circuit 110, pass device 125, and coupling element 130. The compensation circuit 105 can include a current sense device 115, a current sense device 120, a driver circuit 140, a current sink device 145, filter circuit 150, and a current sink device 155.

The current sense device 115 and the current sense device 120 can each include an adjustable current source, a voltage-to-current converter, or a transconductance device, such as a FET or a BJT. The current sense device 115 and the current sense device 120 can each be a scaled version of the pass device 125, such as to enable the each of the current sense devices to generate a reference or mirror current proportional to the output current in branch 126. For example, when the pass device 125 is an N-type FET (NFET) having a width-to-length ratio (W/L), scaled by an integer (N), such that the size of the pass device is N·(W/L), each of the current sense devices can be NFETs having width-to-length ratios W/L. The current sense device 115 and the current sense device 120 can be configured to generate, respectively, a first sensed current and a second sensed current based on the control signal in branch 101. The first sensed current and the second sensed current can be proportional to the output current in branch 126, such that the ratio of the current in branch 126 to the first or second sensed current is equivalent to the ratio of the size of the pass device 125 to the size of the sense devices. The first current and the second current can be coupled to current sink device 145 and current sink device 155, respectively. The current sink device 145 and the current sink device 155 can each include an adjustable current source, a voltage-to-current converter, or a transconductance device, such as an NFET, configured to selectively sink the first current and the second current, such as according to a control signal generated by driver circuit 140.

The driver circuit 140 can be any voltage controlled circuit configured to generate an output signal in branch 141 in response to a first voltage developed across current sink device 145 and a second voltage developed across current sink device 155. The driver circuit 140 can cause the current sink device 145 and the current sink device 155 to selectively sink the first current and the second current by generating a control signal in branch 141 to adjust the amount of current sunk by each current sink device, such as to cause the voltages in branch 116 and branch 117 to be substantially the same, or to maintain an equilibrium state or difference. The driver 140 can directly control the current sink device 145 using the control signal generated in branch 141, while driver 140 can indirectly control the current sink device 155 through the filter circuit 150. The filter circuit 150 can be a low-pass filter, such as a resistor-capacitor (RC) low-pass filter, configured to reject signals that have a frequency above a threshold frequency.

For DC and frequencies below a threshold frequency, such as DC or low frequency components of signals in the control loop of LDO regulator 100, the filter circuit 150 can enable the current sink device 155 to receive substantially the same control signal as current sink device 145, such that the control signal received at each current sink device has substantially the same voltage. For these DC or low frequencies, this control signal can cause the current sink device 145 and the current sink device 155 to sink substantially the same amount of the current in branch 116 and branch 117, respectively.

Device matching between the current sense device 115 and the current sense device 120, and corresponding device matching between the current sink device 145 and the current sink device 155 can ensure that the amount of current sunk by the current sink device 155 is equivalent to the amount of current flowing through branch 117 at DC and low frequencies. As a result, no current will flow through coupling element 130 under these DC or low frequency conditions. This can cause the voltage dropped across the coupling element 130 to be zero, or approximately zero, volts. Thus, the feedback sense voltage offset generated by the coupling element 130 can be essentially zero at DC and low frequencies.

While the current sink device 145 can sink all the current generated by the current sense device 115, the current sink device 155 can sink only the low frequency components of the current generated by the current sense device 120 because the current sink device 155 is driven by the filtered output of the driver 140. Consequently, the high frequency components of the current generated by the current sense device 120 flows through the coupling element 130, such as to cause a voltage drop across the coupling element. This drop across the coupling element at high frequencies helps isolate the control loop of the LDO regulator 100 from the high frequency resonance in the external circuit 135 (board trace parasitics and load capacitor). Without this isolation, the resonance of the external circuit 135 can cause instability in the control loop of the LDO regulator 100.

When the coupling element 130 is a resistor, the voltage drop across this resistor can create a zero in the control loop of the LDO regulator 100. The filter circuit 150 can be selected to have filtering, or frequency, characteristics that determine, among other things, the frequency of the zero. Such filtering characteristics can be selected to create phase shift in the feedback path to EA 110, such as to stabilize the control loop of the LDO regulator 100.

Figure 2:
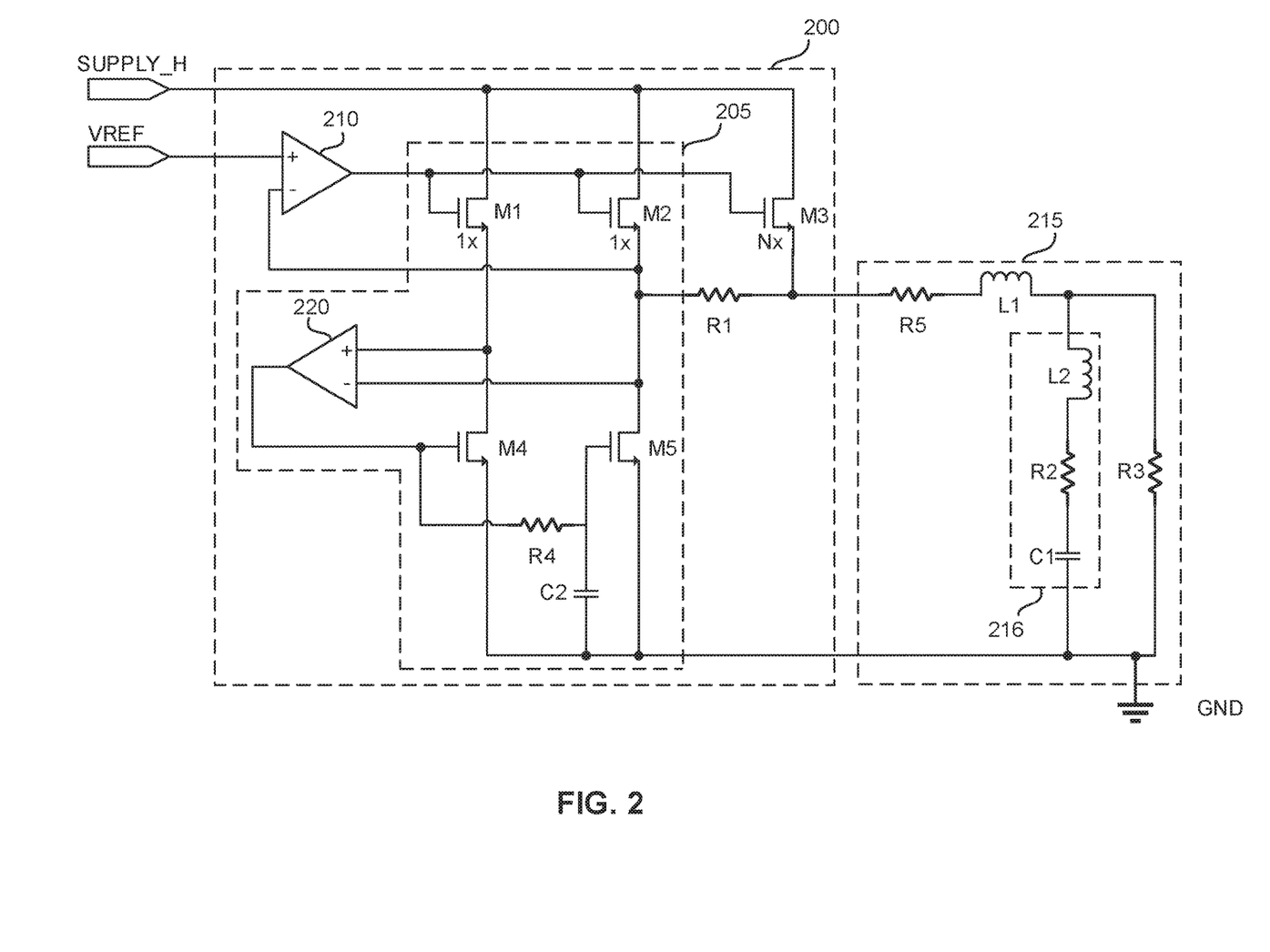
FIG. 2 depicts a schematic diagram of an example of an implementation of a low dropout linear regulator having an internally compensated effective series resistance, according to various embodiments.

FIG. 2 depicts a schematic diagram of an example of an implementation of an LDO regulator 200 having an internally compensated effective series resistance, according to various embodiments. The LDO regulator 200 can be coupled to one or more external circuits, such as the external circuit 215. The LDO regulator 200 can be an example of the LDO regulator 100 (FIG. 1), while external circuit 215 can be an example of the external circuit 135 (FIG. 1). The external circuit 215 can include parasitic inductance L1, parasitic resistance R5, and a load that can be modelled as a capacitive element 216 and resistor R3. The capacitive element 216 can include an inductive component L2, a resistive component R2, and a capacitive component C1. The LDO regulator 200 can include differential amplifier 210, compensation circuit 205, an NFET M3, and resistor R1, such as to correspond, respectively, to the EA circuit 110, compensation circuit 105, pass device 125, and coupling element 130 of FIG. 1. The compensation circuit 205 can include an NFETs M1, M2, M4, and M5, as well as differential amplifier 220, and a low pass RC filter formed by resistor R4 and capacitor C2, such as to correspond, respectively, to the current sense device 115, the current sense device 120, the current sink device 145, the current sink device 155, the driver circuit 140, and the filter circuit 150 of FIG. 1.

The sizes of M1 and the M2 can be scaled proportional to the size of M3, such as to cause the width-to-length ratio, or aspect ratio, of M3 to be a multiple (N) of the width-tolength-ratio of M1 or M2. The factor N can be selected to determine the value of the internally compensated ESR ($R_{dc\_esr}$) according to equation (1), such as to enable greater flexibility in the selection of load capacitor 216 or other elements of the external circuit 215. In some embodiments, the resistor R1 or the factor N can be selected to ensure that $R_{dc\_esr}$ is larger than the sum of R2 and R5.

$$R_{dc\_esr} = \frac{R1}{N} \quad (1)$$

The sizes of transistors M1, M2, M4 and M5 can be selected so as to cause the ratio of the sizes of M2 to M1 to be equal to the ratio of the sizes of M5 to M4. Transistors M4 and M5 can be sized to have any ratio with respect to each other, subject to the previously stated relationship. Similarly, M1 and M2 can be sized to have any ratio with respect to each other, subject to the previously stated relationship and other considerations described herein.

The resistor R4 and capacitor C2 of the low pass filter can be selected to determine, among other things, a frequency characteristic of the internally compensated ESR, such as the corner frequency ($\text{freq}_{dc\_esr}$) of the internally compensated ESR, such as indicated by equation (2).

$$\text{freq}_{dc\_esr} = \frac{1}{2\pi \cdot R4 \cdot C2} \quad (2)$$

Resistor R4 and capacitor C2 can be chosen such that the corner frequency $\text{freq}_{dc\_esr}$ of the resulting low-pass filter is lower than a corner frequency ($\text{freq}_{tot\_esr}$) caused by the ESR (R2) of the output capacitor 216, and the resonance frequency ($\text{freq}_{LC}$) of the combination of parasitic inductance L and output capacitor 216, as indicated by equation (3) and equation (4), respectively. In general, R4 and C2 can be selected based on the parasitic inductance L1, the parasitic resistance R5, and the load capacitor 216, such as to enable greater flexibility in the placement of the external circuit 215 and in the selection of the load capacitor 216.

$$\text{freq}_{tot\_esr} = \frac{1}{2\pi \cdot \left(\frac{R1}{N} + R2 + R5\right) \cdot C1} \quad (3)$$

$$\text{freq}_{LC} = \frac{1}{2\pi \sqrt{(L1 + L2) \cdot C1}} \quad (4)$$

Figure 3:
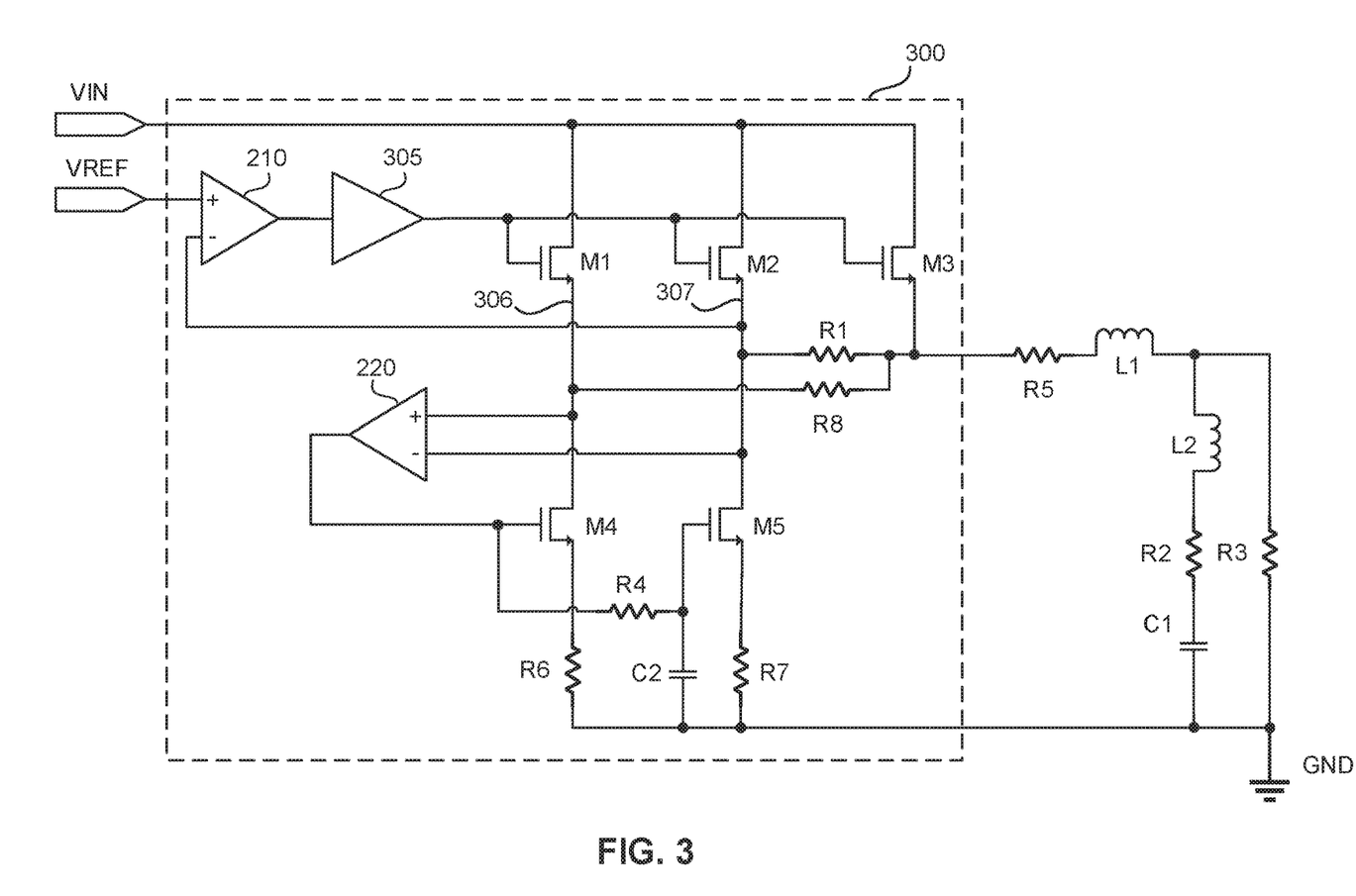
FIG. 3 depicts a schematic diagram of a second example of an implementation of low dropout linear regulator having an internally compensated effective series resistance, according to various embodiments.

FIG. 3 depicts a schematic diagram of a second example of an implementation of an LDO regulator 300 having an internally compensated effective series resistance, according to various embodiments. The LDO regulator 300 can be an example of the LDO regulator 100 (FIG. 1), modified to include a buffer circuit 305, a feedback resistor R8, and gain degenerative resistors R6 and R7. The buffer 305 can be added to the LDO regulator 100 to reduce the impedance of the control signal driving NFETs M1, M2, M3, such as to account for a possible large gate capacitance on M3. The feedback resistor R8 can be selected to establish a desired bias point at the feedback input of differential amplifier 210 under low LDO regulator load current conditions, such as when a low output current is generated by M3. The feedback resistor R8 can be two or more orders of magnitude larger than the resistor R1. Quiescent current of the LDO regulator 300 can be limited or reduced by reducing the sizes of M1 and M2.

Figure 4:
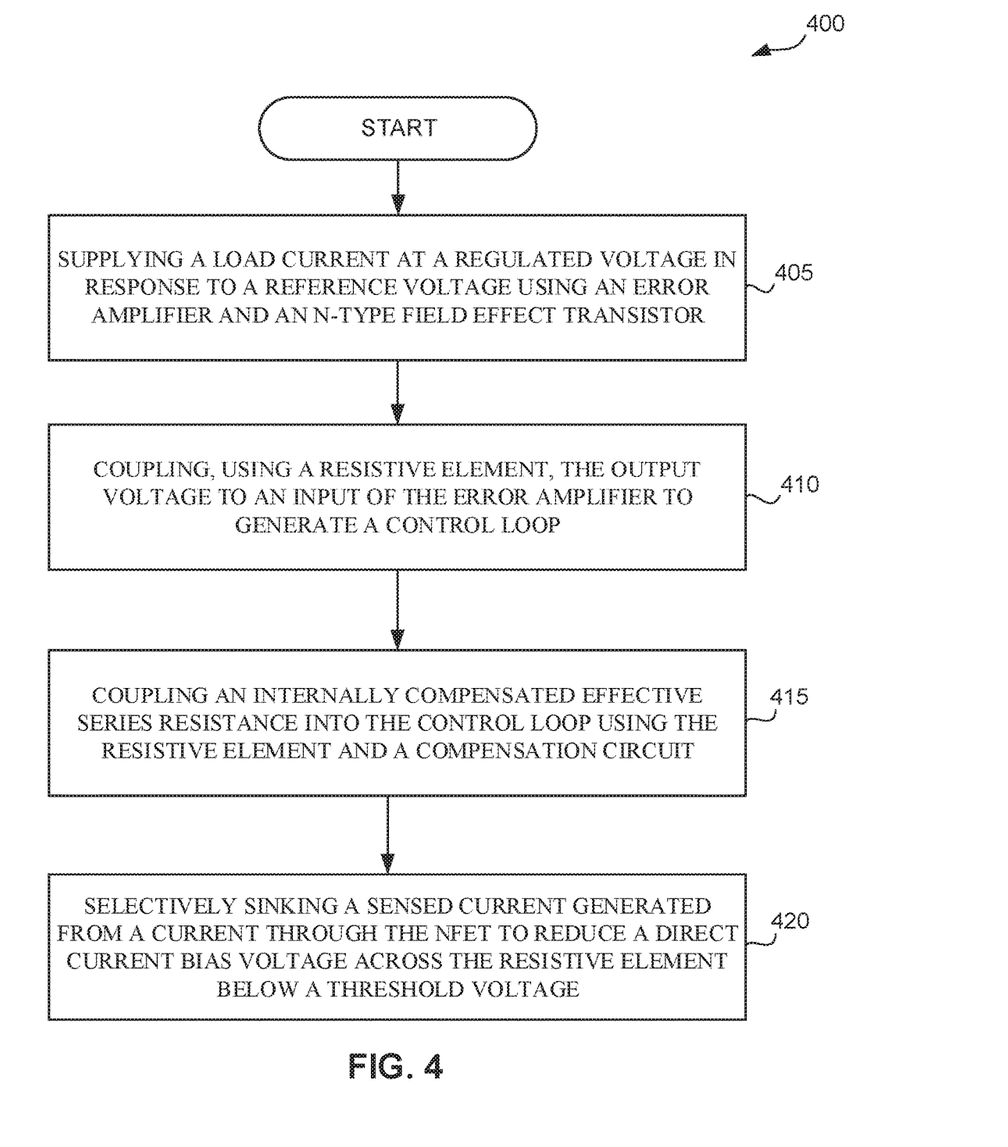
FIG. 4 depicts a set of operations for operating a low dropout linear regulator having an internally compensated effective series resistance, according to various embodiments.

FIG. 4 depicts a set of operations 400 for operating a low dropout linear regulator having an internally compensated effective series resistance, according to various embodiments. Operation 405 can be executed to generate an output current at a regulated output voltage in response to a reference voltage using an error amplifier and an N-type field effect transistor (NFET). Operation 410 can be executed to couple a portion of the output voltage to a feedback input of the error amplifier to form a control loop, such as to maintain the level of the output voltage at the source of the NFET. The output voltage at the source of the NFET can be coupled to the feedback input of the error amplifier using a coupling or resistive element, such as resistor. Operation 415 can be executed to couple an internally compensated effective series resistance into the control loop using the resistive element and a compensation circuit, such as the compensation circuit 105 (FIG. 1), and 205 (FIG. 2). Operation 420 can be executed to selectively sink a sensed current generated based on a current through the NFET (e.g., the output current) to reduce a direct current bias voltage across the resistive element below a threshold voltage, as described herein. The sensed current can include a first current and a second current. The first current can be coupled to both the feedback input of the error amplifier and the resistive element. Selectively sinking the sensed current can include sinking the first current when a frequency of an alternating current component of the current through the NFET is below a threshold frequency. Selectively sinking the sensed current can also include rejecting (e.g., not sinking) an alternating component of the current through the NFET when the frequency of the alternating current component is above the threshold frequency. The filtered portion of the first current can be determined using a resistor-capacitor (RC) circuit, where the RC circuit is selected to determine, among other things, a frequency characteristic of the internally compensated effective series resistance, as described herein.

Figure 5:
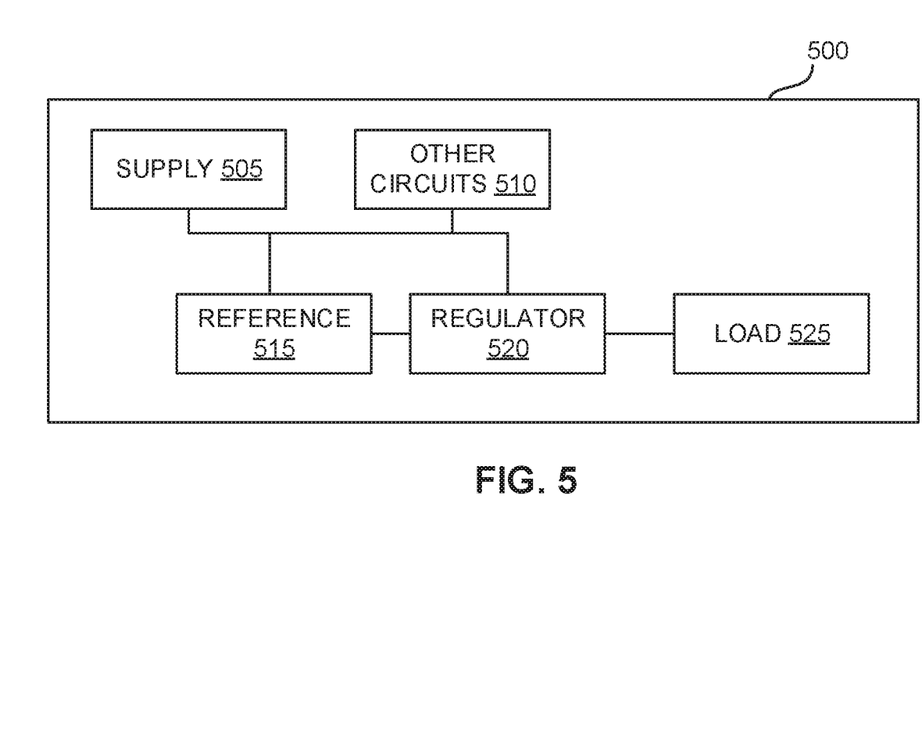
FIG. 5 depicts a block diagram of a system configured with a low dropout linear regulator having an internally compensated effective series resistance, according to various embodiments.

FIG. 5 depicts a block diagram of a system 500 configured with a LDO regulator 520 having an internally compensated effective series resistance, according to various embodiments. The system 500 can include a voltage supply 505, a reference 515, the LDO regulator 520, and a load circuit 525. The system can also include one or more other circuits 510. The regulator 520 can be an example of the LDO regulator 100 (FIG. 1), 200 (FIG. 2), or 300 (FIG. 3). The load circuit 525 can be an example of the load circuit 135 (FIG. 1) or 215 (FIG. 2). The system 500 can be operated to cause the regulator 520 to generate a regulated voltage using voltage supply 505 and reference voltage 515 to drive the load circuit 525.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A voltage regulator circuit having an internally compensated effective series resistance, the circuit comprising:
    a control circuit to generate an output current at a regulated output voltage based on a reference voltage, the control circuit compromising:
        a first amplifier circuit,
        a feedback element coupled to feedback the output voltage to an input of the first amplifier circuit, and
        a compensation circuit coupled to the control circuit and to the feedback element to couple the internally compensated effective series resistance into the control circuit, the compensation circuit comprising:
            a first device, arranged to generate a first sensed current proportional to a current through an N-type pass-device,
            a second device, coupled to the feedback element and to the input of the first amplifier circuit, the second device being arranged to generate a second sensed current proportional to the current through the N-type pass-device, and
            a bias circuit coupled to sink the first sensed current and the second sensed current to reduce a bias voltage across the feedback element below a threshold voltage.

2. The circuit of claim 1, wherein the bias circuit comprises:
    a first current sink device coupled to a first output terminal of the first current sense device to receive the first sensed current;
    a second current sink device coupled to a second output terminal of the second current sense device to receive the second sensed current; and
    a driver circuit having a first input coupled to the first output terminal, a second input coupled to the second output terminal, and an output coupled to a first control terminal of the first current sink device and to a second control terminal of the second current sink device to cause the first current sink device and the second current sink device to selectively sink, respectively, the first sensed current and the second sensed current.

3. The circuit of claim 2, wherein causing the first current sink device and the second current sink device to selectively sink, respectively, the first sensed current and the second sensed current comprises:
    causing the first current sink device and the second current sink device to sink, respectively, the first sensed current and the second sensed current when frequency components of the output of the driver circuit are lower than a threshold frequency, and
    inhibiting the second current sink device from sinking a portion the second sensed current when the frequency components of the output of the driver circuit are higher than the threshold frequency.

4. The circuit of claim 2, wherein the bias circuit further comprises:
    a resistor-capacitor (RC) network coupled between the output of the driver circuit and the second control terminal, the RC network selected to determine a frequency characteristic of the internally compensated effective series resistance.

5. The circuit of claim 4, wherein the frequency characteristic of the internally compensated effective series resistance comprises a frequency at which the internally compensated effective series resistance causes a specified phase shift in a feedback path to the error amplifier.

6. The circuit of claim 4, wherein:
the circuit further comprises an external circuit having an output resonance frequency, and
the frequency characteristic of the internally compensated effective series resistance comprises a corner frequency at which the internally compensated effective series resistance causes a specified phase-shift a feedback voltage to the error amplifier, the corner frequency being lower than the resonance frequency.

7. The circuit of claim 2, the circuit further comprising an external circuit having a frequency characteristic, and wherein the bias circuit further comprises a resistor-capacitor (RC) network coupled between the output of the driver circuit and the second control terminal to decouple the control circuit from the frequency characteristic of the external circuit.

8. The circuit of claim 7, wherein the RC network is selected to cause the compensation circuit to conduct fluctuations in the second sensed current having a frequency greater than a threshold frequency through the resistive element to the external circuit.

9. The circuit of claim 1, wherein:
the circuit further comprises an external circuit having a frequency characteristic, and
the resistive element is coupled to feedback the output voltage to the input of the error amplifier, the resistive element having a resistance selected based on the frequency characteristic.

10. The circuit of claim 1, wherein:
the first current sense device, the second current sense device, the first current sink device, the second current sink device, and the pass device are field effect transistors, and
the first current sense device and the second current sense device are scaled proportional to the N-type pass device, and the first current sink device and the second current sink device have a same proportion to each other as the first current sense device and the second current sense device, respectively.

11. A method of operating a voltage regulator circuit having an internally compensated effective series resistance, the method comprising:
supplying a load current at a regulated output voltage in response to a reference voltage using an error amplifier and an N-type field effect transistor (NFET);
coupling, using a resistive element, the output voltage to an input of the error amplifier to generate a control loop; and
coupling an internally compensated effective series resistance into the control loop using the resistive element and a compensation circuit, the compensation circuit selectively sinking a sensed current generated based on a current through the NFET to reduce a direct current bias voltage across the resistive element below a threshold voltage.

12. The method of claim 11, wherein:
the sensed current comprises a first current and a second current, the first current being coupled to the input of the error amplifier and to the resistive element; and
selectively sinking the sensed current comprises:
sinking the first current and the second current when a frequency of an alternating current component of the current through the NFET is below a threshold frequency, and
rejecting a filtered portion of the first current when the frequency of the alternating current component is above the threshold frequency.

13. The method of claim 12, further comprising:
determining the filtered portion of the current using a resistor-capacitor (RC) circuit, wherein the RC circuit is selected to determine a frequency characteristic of the internally compensated effective series resistance.

14. The method of claim 12, wherein the frequency characteristic of the internally compensated effective series resistance comprises a frequency at which the internally compensated effective series resistance causes a specified phase shift in a feedback path to the error amplifier.

15. The method of claim 12, wherein the frequency characteristic of the internally compensated effective series resistance comprises a corner frequency at which the internally compensated effective series resistance causes a specified phase-shift a feedback voltage to the error amplifier, the corner frequency being lower than a resonance frequency of a load circuit coupled to the voltage regulator circuit to receive the output voltage.

16. A voltage regulator circuit having an internally compensated effective series resistance, the circuit comprising:
an amplifier circuit;
a first N-type field effect transistor (NFET), the first NFET being driven by the amplifier to generate a current at a regulated output voltage in response to a reference voltage;
a second NFET coupled to the amplifier to generate a first sensed current based on a current flowing through the first NFET;
a third NFET coupled to the amplifier to generate a second sensed based on the current flowing through the first NFET;
a resistor coupled to feedback the output voltage to an input of the amplifier and to a source of the second NFET; and
a driver circuit configured to control the first sensed current and the second sensed current to reduce a direct current bias voltage across the resistor below a threshold voltage.

17. The voltage regulator circuit of claim 16, further comprising:
a fourth NFET having a first input terminal coupled to the second NFET to receive the first sensed current; and
a fifth NFET having a second input terminal coupled to the third NFET to receive the second sensed current;
wherein the driver circuit is further configured to provide a control signal to a first control terminal and to a second control terminal.

18. The voltage regulator circuit of claim 17, further comprising:
a resistor-capacitor (RC) filter circuit coupled between the driver circuit and first control terminal.

19. The voltage regulator circuit of claim 18, wherein the RC filter circuit is configured to cause the fourth NFET to reject fluctuations in the first sensed current having a frequency greater than a threshold frequency.

20. A voltage regulator circuit having an internally compensated effective series resistance, the circuit comprising:
an amplifier circuit;
a pass element comprising an N-type transistor, the pass circuit driven by the amplifier to generate a current at a regulated output voltage in response to a reference voltage;
a first sensing element to generate a first sensed current based on a current flowing through the pass circuit;
a second sensing element to generate a second sensed current based on the current flowing through the pass circuit;

a feedback element to feedback the output voltage to an input of the amplifier and to a source of the first sensing element; and a driver circuit configured to control the first sensed current and the second sensed current to reduce a direct current bias voltage across the feedback element below a threshold voltage.

21. The voltage regulator circuit of claim 20, wherein the feedback element to feedback the output voltage to an input of the amplifier and to a source of the first sensing element is a resistor.

22. The voltage regulator circuit of claim 20, wherein at least one of the first sensing element or the second sensing element is an N type field effect transistor.

23. The voltage regulator circuit of claim 20, further comprising: a third sensing element having a first input terminal coupled to the first sensing element to receive the first sensed current, and a fourth sensing element having a second input terminal coupled to the second sensing element to receive the second sensed current; wherein the driver circuit is further configured to provide a control signal to a first control terminal and to a second control terminal.

24. The voltage regulator circuit of claim 23, further comprising: a resistor-capacitor (RC) filter circuit coupled between the driver circuit and first control terminal.

* * * * *